United States Patent
Chen et al.

(10) Patent No.: US 10,964,738 B2
(45) Date of Patent: Mar. 30, 2021

(54) IMAGE SENSOR HAVING A SOURCE FOLLOWER TRANSISTOR WITH A MULTI-THICKNESS GATE DIELECTRIC

(71) Applicant: OmniVision Technologies, Inc., Santa Clara, CA (US)

(72) Inventors: Gang Chen, San Jose, CA (US); Yuanwei Zheng, San Jose, CA (US); Qin Wang, San Jose, CA (US); Cunyu Yang, Milpitas, CA (US); Guannan Chen, San Carlos, CA (US); Duli Mao, Sunnyvale, CA (US); Dyson Tai, San Jose, CA (US); Lindsay Grant, Campbell, CA (US); Eric Webster, Mountain View, CA (US); Sing-Chung Hu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 93 days.

(21) Appl. No.: 16/149,544

(22) Filed: Oct. 2, 2018

(65) Prior Publication Data

US 2020/0105807 A1    Apr. 2, 2020

(51) Int. Cl.
*H01L 27/146* (2006.01)
*H04N 5/378* (2011.01)
*H04N 9/04* (2006.01)

(52) U.S. Cl.
CPC .. *H01L 27/14614* (2013.01); *H01L 27/14645* (2013.01); *H01L 27/14689* (2013.01); *H04N 5/378* (2013.01); *H04N 9/0455* (2018.08)

(58) Field of Classification Search
None
See application file for complete search history.

(56) References Cited

U.S. PATENT DOCUMENTS 5,314,834 A * 5/1994 Mazure .......... H01L 29/42368
257/324
6,077,749 A * 6/2000 Gardner .......... H01L 21/28185
257/E21.434

(Continued)

FOREIGN PATENT DOCUMENTS

JP    2006228962 A  *  8/2006
JP    2011205037 A  *  10/2011

OTHER PUBLICATIONS

Machine language translation of JP 2011-205037 A (Year: 2011).*

(Continued)

*Primary Examiner* — Erik Kielin
(74) *Attorney, Agent, or Firm* — Christensen O'Connor; Johnson Kindness PLLC

(57) ABSTRACT

An image sensor includes one or more photodiodes disposed in a semiconductor material to receive image light and generate image charge, and a floating diffusion to receive the image charge from the one or more photodiodes. One or more transfer transistors is coupled to transfer image charge in the one or more photodiodes to the floating diffusion, and a source follower transistor is coupled to amplify the image charge in the floating diffusion. The source follower includes a gate electrode (coupled to the floating diffusion), source and drain electrodes, and an active region disposed in the semiconductor material between the source and drain electrodes. A dielectric material is disposed between the gate electrode and the active region and has a first thickness and a second thickness. The second thickness is greater than the first thickness, and the second thickness is disposed closer to the drain electrode than the first thickness.

20 Claims, 4 Drawing Sheets

(56) References Cited

U.S. PATENT DOCUMENTS

| | | | |
|---|---|---|---|
| 8,283,751 B2* | 10/2012 | Kurjanowicz | H01L 27/11206 257/530 |
| 2005/0130441 A1* | 6/2005 | Park | H01L 29/42368 438/770 |
| 2006/0043313 A1 | 3/2006 | Caccia et al. | |
| 2008/0157242 A1* | 7/2008 | Hong | H01L 27/14603 257/431 |
| 2009/0236498 A1* | 9/2009 | Nagaraja | H01L 27/14603 250/208.1 |
| 2011/0204425 A1* | 8/2011 | Lee | H01L 27/14612 257/292 |
| 2012/0181588 A1* | 7/2012 | Anderson | H01L 27/14614 257/290 |
| 2015/0102405 A1* | 4/2015 | Ryu | H01L 29/66659 257/336 |
| 2016/0148961 A1 | 5/2016 | Sze | |
| 2016/0197110 A1 | 7/2016 | Hung et al. | |
| 2016/0240579 A1* | 8/2016 | Sun | G01S 7/4816 |
| 2017/0194372 A1* | 7/2017 | Ha | H01L 27/14614 |
| 2018/0151614 A1* | 5/2018 | Endo | H01L 27/14689 |

OTHER PUBLICATIONS

Machine language translation for JP 2006-228962 A (Year: 2006).*
(ROC) Taiwan Patent Application No. 108131275—Office Action with English translation dated May 1, 2020, 15 pages.

* cited by examiner

IMAGE SENSOR HAVING A SOURCE FOLLOWER TRANSISTOR WITH A MULTI-THICKNESS GATE DIELECTRIC

TECHNICAL FIELD

This disclosure relates generally to semiconductor devices, and in particular but not exclusively, relates to image sensors.

BACKGROUND INFORMATION

Image sensors have become ubiquitous. They are widely used in digital still cameras, cellular phones, security cameras, as well as medical, automobile, and other applications. The technology used to manufacture image sensors has continued to advance at a great pace. For example, the demands of higher resolution and lower power consumption have encouraged the further miniaturization and integration of these devices.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1A:
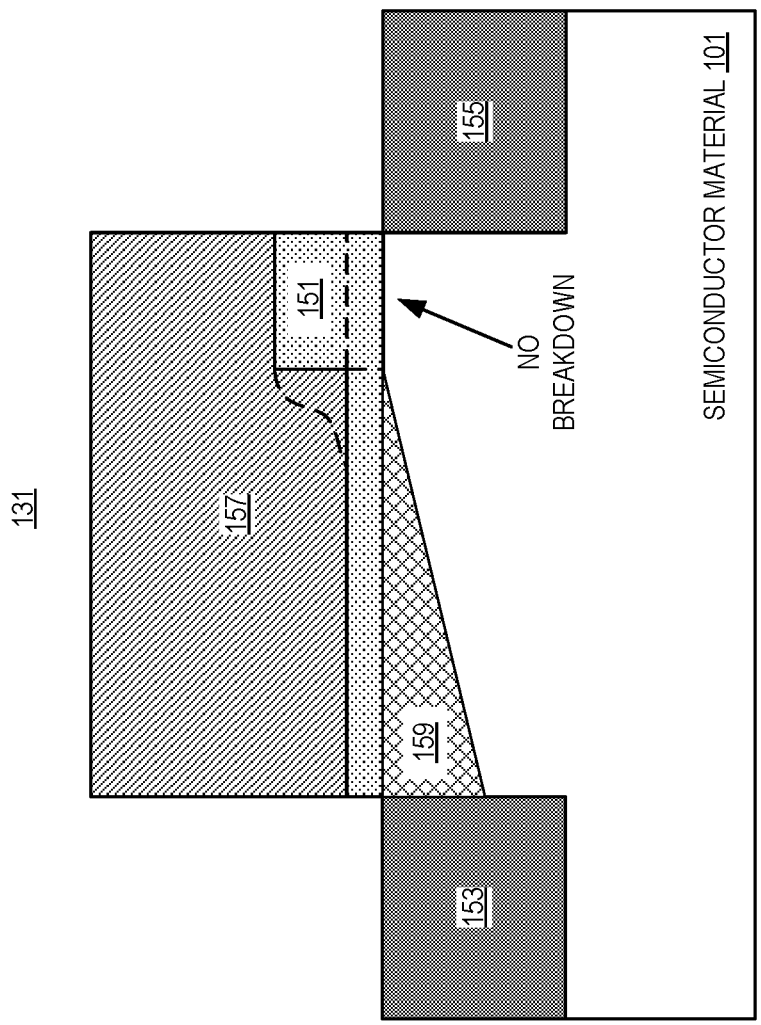
FIG. 1A is a cross sectional illustration of a transistor, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for multi-thickness gate dielectric are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Reducing read noise (RN) and random telegraph signal (RTS) noise are the next goals for enhancing complementary metal oxide semiconductor (CMOS) image sensors, as pixel size reduction may be approaching a wall. One technique to lower both RN and RTS noise performance is thinning the source follower transistor dielectric. The thinner the gate oxide, the faster the pixel read out and higher frame rate, as the transconductance increases. However, gate leakage and reliability limit the final gate oxide thickness: a very thin dielectric may leak and critically breakdown. Moreover, the source follower may slide to linear operation if the threshold voltage control is not accurate, which leads to other issues like photo-response non uniformity (PRNU), black dots, and so on. A novel source follower gate oxide scheme is proposed to solve all the above concerns (e.g., minimize RN and RTS noise, without sacrificing leakage, or reliability, etc.). Additionally, this new scheme may also lower the cost of the pixel by adopting back side illuminated thick and thin gate oxides for the source follower, thus saving an extra gate oxide growth step. Put another way, the device herein may make use of the existed gate oxides, both thick and thin, and may not need to introduce a third, newer gate oxide (e.g., the thick portion of the gate oxide grows together with the thick gate oxide, and the thin portion grows together with the thin gate oxide).

In some embodiments a thinned gate oxide (e.g., to ~30 Å thickness), can achieve better RN/RTS noise. Looking carefully at SF working conditions, the maximum electric field occurs between the gate and substrate near the drain. Thus, as disclosed herein, increasing the gate oxide thickness proximate to the drain lowers the risk of leakage and breakdown; allows further thinning of the gate oxide in the channel region; and further lowers RN and RTS noise. Moreover, having a multi-thickness gate oxide assures the source follower transistor will operate in the saturation region.

The following disclosure will further describe the embodiments discussed above, and other embodiments, as they relate to the figures.

FIG. 1A is a cross sectional illustration of transistor 131, in accordance with the teachings of the present invention. In the depicted example, transistor 131 is a source follower transistor 131 disposed in semiconductor material 101 coupled to amplify the image charge in a floating diffusion in an image sensor pixel. However, in other examples, transistor 131 may be any other transistor in an image sensor pixel (e.g., transfer transistor, reset transistor, row select transistor, or the like). Depicted is gate electrode 157 coupled to the floating diffusion (see e.g., FIG. 1B). Also depicted are source electrode 153 and drain electrode 155. Active region (including channel 159) is disposed in the semiconductor material between source electrode 153 and drain electrode 155. Dielectric material 151 is disposed between gate electrode 157 and active region, and dielectric material 151 has a first thickness and a second thickness, where the second thickness is greater than the first thickness. The second thickness is disposed closer to the drain electrode 155 than the first thickness. As stated above, this prevents breakdown of dielectric material 151 since the electric fields when transistor 131 is operating are highest near drain electrode 155. Put another way, the second thickness is greater than or equal to a thickness required to prevent breakdown of dielectric material 155 when the source follower transistor 131 is operating in a saturation regime. In this embodiment, the first thickness (thinner region) may be 30 Å or less, and the second thickness may be at least twice as thick as the first thickness (e.g., 60 Å).

As shown in the depicted example, dielectric material 151 may transition from the first thickness to the second thickness with a step-like function. Or alternatively, dielectric material 151 may gradually transition (represented by the dashed line) from the first thickness to the second thickness. In some embodiments, dielectric material 151 may include a plurality of materials, and may have multiple layers. For example, the first thickness may have a first material composition, and the second thickness may have another material composition disposed on the first thickness (e.g., shown in the depicted example with horizontal dashed line though second thickness). In some embodiments, where there are layers of different dielectrics, the dielectrics may have different dielectric constants. The layer of dielectric closest to the active region may have a higher dielectric constant than a material further away from semiconductor material 101. Conversely, the layer of dielectric furthest from the active region may have a higher dielectric constant than the material closest to semiconductor material 101. In one embodiment, the first thickness has a first material composition and the second thickness has a second material composition (shown with vertical dashed line dividing first and second thickness). Put another way, the thicker portion of the dielectric material 151 may have a composition that is different than the rest of dielectric material 151.

In some examples, dielectric material 155 may also include oxides/nitrides such as silicon oxide ($SiO_2$), hafnium oxide ($HfO_2$), silicon nitride ($Si_3N_4$), silicon oxynitride ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), or the like. Additionally, one skilled in the relevant art will recognize that any stoichiometric ratio of the above metals/semiconductors and their oxides/nitrides/oxynitrides may be used, in accordance with the teachings of the present invention. Put another way, "hafnium oxide" may refer to $HfO_2$ or another stoichiometric ratio (e.g., $HfO_x$).

Figure 1B:
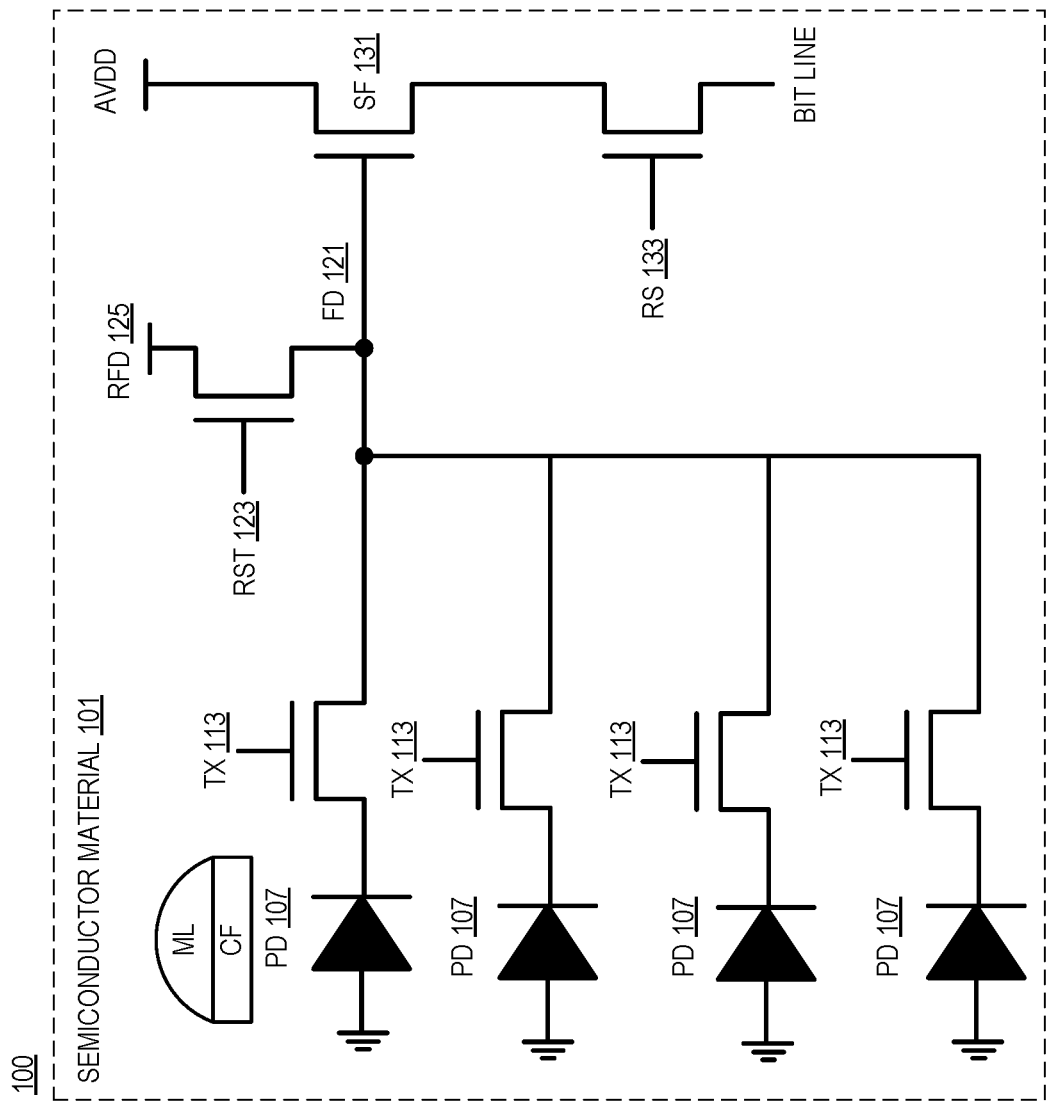
FIG. 1B is a circuit diagram of a pixel including the transistor of FIG. 1A, in accordance with the teachings of the present invention.

FIG. 1B is a circuit diagram of a pixel 100 including transistor 131 of FIG. 1A, in accordance with the teachings of the present invention. In the depicted example, image sensor 100 includes: semiconductor material 101, plurality of photodiodes 107, one or more transfer transistors 113, floating diffusion 121, reset transistor 123, source follower transistor 131, and row select transistor 133. Plurality of photodiodes 107 is disposed in semiconductor material 101 to accumulate image charge in response to incident image light directed into plurality of photodiodes 107. In one example, semiconductor material 101 may include silicon, but may include other suitable semiconductor materials (e.g., germanium or the like) and dopant atoms. Plurality of transfer transistors 113 is also disposed in semiconductor material 101 and individual transfer transistors 113 in plurality of transfer transistors 113 are coupled to individual photodiodes 107 in plurality of photodiodes 107. Floating diffusion 121 is disposed in semiconductor material 101, and floating diffusion 121 is coupled to the plurality of transfer transistors 113 to receive image charge from plurality of photodiodes 107 in response to a transfer signal sequentially applied to a control terminal of each individual transfer transistor 113. In other words, in the depicted example, a transfer signal is applied to the control terminal of the top transfer transistors 113, then a transfer signal is applied to the control terminal of the second-from-the-top transfer transistors 113, etc. Reset transistor 123 is coupled to floating diffusion 121 to extract the image charge from floating diffusion 121 and reset the charge on floating diffusion 121 in response to a rest signal being applied to a gate terminal of reset transistor 123. Further, source follower transistor 131 is coupled to floating diffusion 121 to amplify the signal on floating diffusion, and row select transistor 133 is coupled between an output of source follower transistor 131 and a bit line output.

In the depicted example, plurality of photodiodes 107 includes four photodiodes 107 coupled to floating diffusion 121 through transfer transistors 113. However, in a different example, any number of photodiodes 107 may be coupled to floating diffusion 121 including two, six, and eight photodiodes 107. In one example, the four photodiodes 107 include one photodiode 107 disposed to absorb green light, one photodiode 107 disposed to absorb blue light, one photodiode 107 disposed to absorb red light, and one photodiode 107 disposed to absorb infrared light. Color selection may be accomplished by placing a color filter (e.g., "CF") layer proximate to semiconductor material 101. In one example, the color filter layer includes red, infrared, green, and blue color filters which may be arranged into a Bayer pattern, EXR pattern, X-trans pattern, or the like. However, in a different or the same example, the color filter layer may include infrared filters, ultraviolet filters, or other light filters that isolate invisible portions of the EM spectrum. In the same or a different example, a microlens layer (e.g., "ML") is formed on the color filter layer. The microlens layer may be fabricated from a photo-active polymer that is patterned on the surface of the color filter layer. Once rectangular blocks of polymer are patterned on the surface of the color filter layer, the blocks may be melted (or reflowed) to form the dome-like structure characteristic of microlenses.

Figure 2:
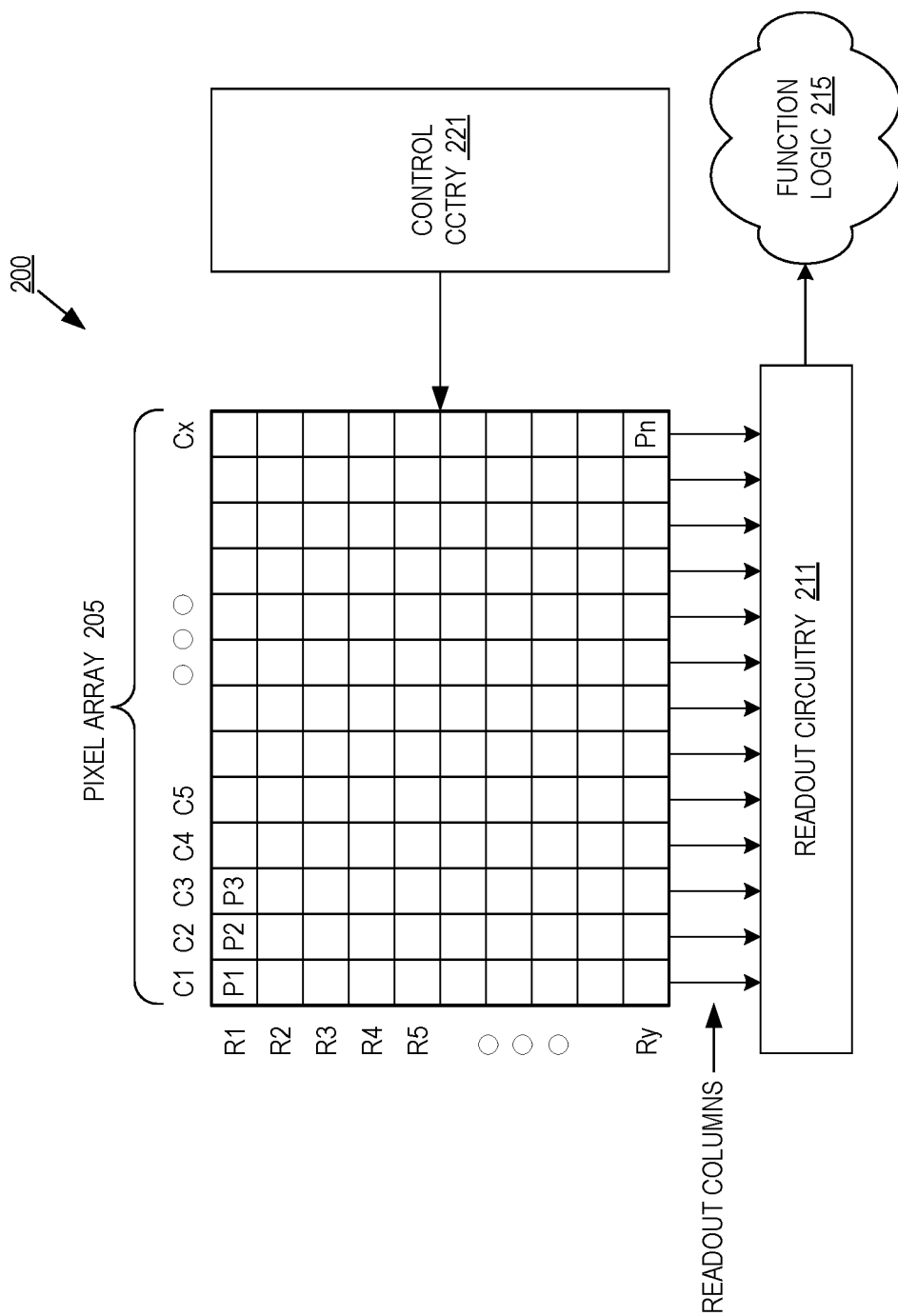
FIG. 2 is a block diagram illustrating one example of an imaging system including the pixel of FIG. 1B, in accordance with the teachings of the present invention.

FIG. 2 is a block diagram illustrating one example of imaging system 200 including the image sensor of FIG. 1A, in accordance with the teachings of the present invention. Imaging system 200 includes pixel array 205, control circuitry 221, readout circuitry 211, and function logic 215. In one example, pixel array 205 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 205 has acquired its image data or image charge, the image data is readout by readout circuitry 211 and then transferred to function logic 215. In various examples, readout circuitry 211 may include amplification circuitry, analog-to-digital (ADC) conversion circuitry, or otherwise. Function logic 215 may simply store the image data or even manipulate the image data by applying post image effects (e.g., crop, rotate, remove red eye, adjust brightness, adjust contrast, or otherwise). In one example, readout circuitry 211 may readout a row of image data at a time along readout column lines (illustrated) or may readout the image data using a variety of other techniques (not illustrated), such as a serial readout or a full parallel readout of all pixels simultaneously.

In one example, control circuitry 221 is coupled to pixel array 205 to control operation of the plurality of photodiodes in pixel array 205. For example, control circuitry 221 may generate a shutter signal for controlling image acquisition. In one example, the shutter signal is a global shutter signal for simultaneously enabling all pixels within pixel array 205 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 200 may be included in a digital camera, cell phone, laptop computer, automobile or the like. Additionally, imaging system 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, or manipulate image data supplied by imaging system 200.

Figure 3:
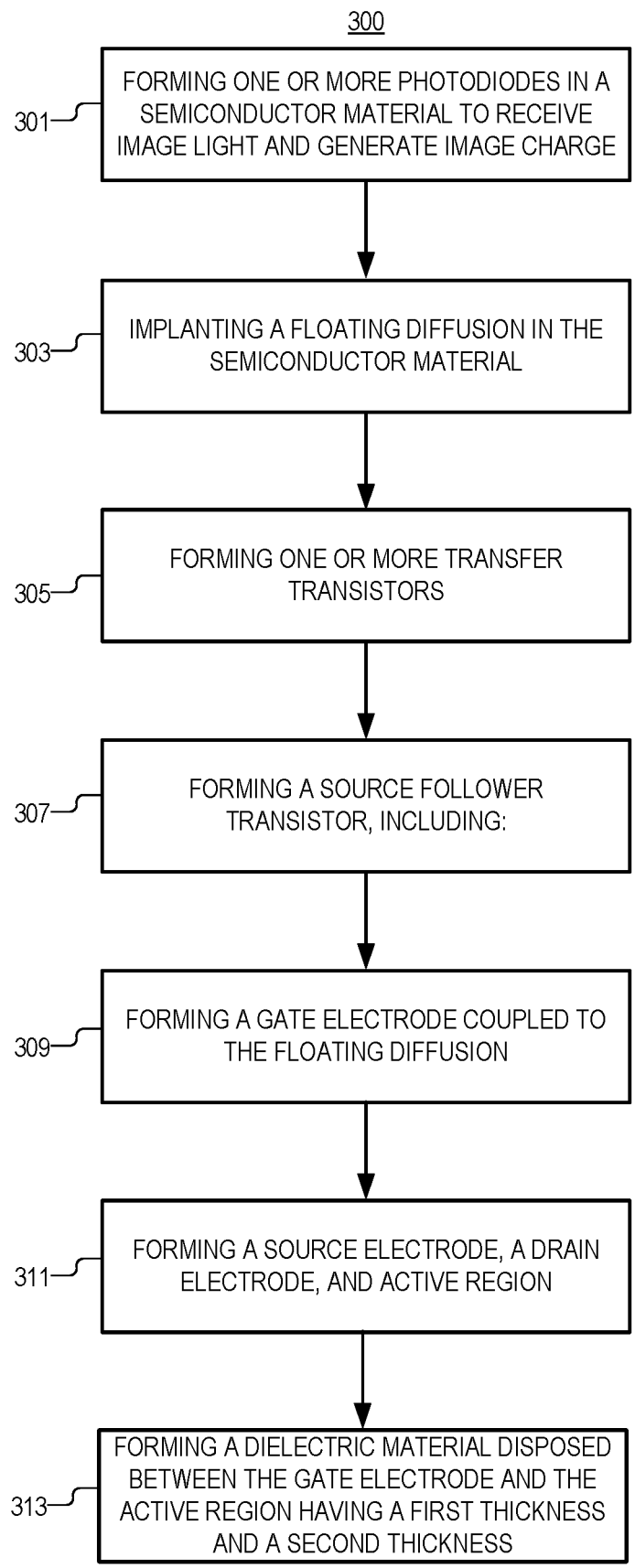
FIG. 3 illustrates an example method for forming the image sensor of FIG. 1A, in accordance with the teachings of the present invention.

FIG. 3 illustrates a method 300 for fabricating the image sensor of FIG. 1A, in accordance with the teachings of the present invention. The order in which some or all process blocks appear in method 300 should not be deemed limiting. Rather, one of ordinary skill in the art having the benefit of the present disclosure will understand that some of method 300 may be executed in a variety of orders not illustrated, or even in parallel. Furthermore, method 300 may omit certain process blocks in order to avoid obscuring certain aspects. Alternatively, method 300 may include additional process blocks that may not be necessary in some embodiments/examples of the disclosure.

Block 301 illustrates forming one or more photodiodes in a semiconductor material to receive image light and generate image charge. This may include implanting (e.g., via ion implantation) one or more dopants (e.g., P, As, B, or the like) into the semiconductor material (e.g., silicon) to form a p-n junction (e.g., a pinned photodiode).

Block 303 shows implanting a floating diffusion into the semiconductor material to receive the image charge from the one or more photodiodes. In some examples, this implantation step may occur at the same time, and using the same dopant materials, as implanting one or more of the dopants to form the photodiodes.

Block 305 depicts forming one or more transfer transistors coupled to transfer image charge in the one or more photodiodes to the floating diffusion. In one example, this may include forming a gate above a surface of semiconductor material. The transfer gate may be highly-doped polycrystalline silicon deposited via chemical vapor deposition or the like followed by an ion implantation step. The transfer transistor may also include a source electrode, a drain electrode, and an active region which are formed via ion implantation into the semiconductor substrate. And the gate may be disposed above the active region.

Block 307 shows forming a source follower transistor coupled to amplify the image charge in the floating diffusion. In the depicted example, this includes all of the following steps in blocks 309-313. It is appreciated that portions of the source follower may be formed at the same time as portions of the one or more transfer transistors.

Block 309 depicts forming a gate electrode of the source follower coupled to the floating diffusion. For example, the gate electrode could be formed using heavily doped (e.g., conductive) polycrystalline silicon deposited on the surface of the semiconductor material (e.g., at the same time as the transfer transistor's gate electrode was formed).

Block 311 illustrates forming a source electrode and a drain electrode and an active region in the semiconductor material. The active region is disposed between the source electrode and the drain electrode. Forming the source electrode, drain electrode, and active region may include implanting dopant into the semiconductor material. The source and drain electrodes may have a higher dopant concentration (and an opposite majority charge carrier type) than the active region (as measured by dopant atoms per $cm^3$).

Block 313 illustrates forming (e.g., depositing or growing) a dielectric material disposed between the gate electrode and the active region having a first thickness and a second thickness. The second thickness is greater than the first thickness, and the second thickness is disposed closer to the drain electrode than the first thickness (e.g., the second thickness extends laterally to, or even past, the edge of the drain electrode closest to the gate electrode). This results in the source follower transistor having a very thin dielectric across most of the surface except where the electric field is highest (proximate to the drain electrode). Thus, the second thickness is greater than or equal to a thickness required to prevent breakdown when the source follower transistor is operating in a saturation regime. In some embodiments, forming the dielectric material includes forming the first thickness of the dielectric material which may be 30 Å or less. In some examples, the second thickness may be at least twice as thick as the first thickness. The dielectric material may be formed from any of the materials listed above, as well as combinations of the materials and their constituent elements. Moreover, the dielectric material may include more than one of these materials. The materials may be deposited by chemical vapor deposition, atomic layer deposition, molecular beam epitaxy or the like. The dielectric material may also be created via thermal growth of an oxide or the like.

Although depicted elsewhere, in some embodiments, a reset transistor may be formed. The reset transistor is coupled to the floating diffusion to reset charge in the floating diffusion in response to a rest signal being applied to a gate terminal of the reset transistor. Similarly, a row select transistor may be formed that is coupled between an output of the source follower transistor and a bit line output. Portions of the reset and row select transistors may be formed at the same time as portions of the source follower and transfer transistors.

In some embodiments, control circuitry may be formed (e.g., in part in the semiconductor material around a periphery of the image sensor) and coupled to control operation of the one or more photodiodes. Similarly, readout circuitry may be formed and coupled to the bitline to read out image data from the one or more photodiodes. Function logic may similarly be formed and coupled to the readout circuitry to manipulate the image data.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   one or more photodiodes disposed in a semiconductor material to receive image light and generate image charge;
   a floating diffusion to receive the image charge from the one or more photodiodes;
   one or more transfer transistors coupled to transfer image charge in the one or more photodiodes to the floating diffusion; and
   a source follower transistor coupled to amplify the image charge in the floating diffusion, including:
      a gate electrode coupled to the floating diffusion;
      a source electrode and a drain electrode;
      an active region disposed in the semiconductor material between the source electrode and the drain electrode; and
      a dielectric material disposed between the gate electrode and the active region, the dielectric material including a first portion with a first thickness and a second portion with a second thickness, wherein the first portion of the dielectric material with the first thickness and the second portion of the dielectric material with the second thickness are both disposed between the source electrode and the drain electrode, wherein the first portion of the dielectric material with the first thickness and the second portion of the dielectric material with the second thickness are both disposed underneath the gate electrode between the gate electrode and the active region, wherein the second thickness is greater than the first thickness, wherein the second portion of the dielectric material with the second thickness is disposed closer to the drain electrode than the first portion of the dielectric material with the first thickness, and wherein a first lateral edge of the drain electrode and a second lateral edge of the gate electrode each extend to a third lateral edge of the second portion of the dielectric material with the second thickness.

2. The image sensor of claim 1, wherein the first thickness is 30 Å or less.

3. The image sensor of claim 1, wherein the second thickness is greater than or equal to a thickness required to prevent breakdown when the source follower transistor is operating in a saturation regime.

4. The image sensor of claim 3, wherein the second thickness is at least twice as thick as the first thickness.

5. The image sensor of claim 3, wherein the dielectric material gradually transitions from the first thickness to the second thickness between the gate electrode and the active region of the semiconductor material.

6. The image sensor of claim 1, further comprising a reset transistor coupled to the floating diffusion to reset charge in the floating diffusion in response to a rest signal being applied to a second gate terminal of the reset transistor.

7. The image sensor of claim 1, further comprising a row select transistor coupled between an output of the source follower transistor and a bit line output.

8. The image sensor of claim 1, wherein the dielectric material includes at least one of hafnium oxide, silicon oxide, silicon nitride, or aluminum oxide.

9. The image sensor of claim 1, further comprising control circuitry coupled to control operation of the one or more photodiodes; and
   readout circuitry coupled to a bit line to read out image data from the one or more photodiodes.

10. The image sensor of claim 1, wherein the first portion of the dielectric material has a first composition different than a second composition of the second portion of the dielectric material.

11. The image sensor of claim 10, wherein the dielectric material includes a plurality of materials forming a plurality of layers disposed between the gate electrode and the active region of the semiconductor material, wherein the plurality of layers includes a first dielectric layer disposed closer to the active region of the semiconductor material than a second dielectric layer included in the plurality of layers, and wherein a first dielectric constant of the first dielectric layer is greater than a second dielectric constant of the second dielectric layer.

12. The image sensor of claim 10, wherein the dielectric material includes a plurality of materials forming a plurality of layers disposed between the gate electrode and the active region of the semiconductor material, wherein the plurality of layers includes a first dielectric layer disposed farther from the active region of the semiconductor material than a second dielectric layer included in the plurality of layers, and wherein a first dielectric constant of the first dielectric layer is greater than a second dielectric constant of the second dielectric layer.

13. A method of image sensor fabrication, comprising:
   forming one or more photodiodes in a semiconductor material to receive image light and generate image charge;
   implanting a floating diffusion in the semiconductor material to receive the image charge from the one or more photodiodes;
   forming one or more transfer transistors coupled to transfer image charge in the one or more photodiodes to the floating diffusion; and
   forming a source follower transistor coupled to amplify the image charge in the floating diffusion, including:
      forming a gate electrode coupled to the floating diffusion;
      forming a source electrode and a drain electrode;
      implanting an active region in the semiconductor material between the source electrode and the drain electrode; and
      forming a dielectric material disposed between the gate electrode and the active region, wherein the dielectric material includes a first portion with a first thickness and a second portion with a second thickness, wherein the first portion of the dielectric material with the first thickness and the second portion of the dielectric material with the second thickness are both disposed between the source electrode and the drain electrode, wherein the first portion of the dielectric material with the first thickness and the second portion of the dielectric material with the second thickness are both disposed underneath the gate electrode between the gate electrode and the active region, wherein the second thickness is greater than the first thickness, wherein the second portion of the dielectric material with the second thickness is disposed closer to the drain electrode than the first portion of the dielectric material with the first thickness, and wherein a first lateral edge of the drain electrode and a second lateral edge of the gate electrode each extend to a third lateral edge of the second portion of the dielectric material with the second thickness.

14. The method of claim 13, wherein forming the dielectric material includes forming the first thickness of the dielectric material of 30 Å or less.

15. The method of claim 13, wherein forming the dielectric material includes forming the second portion of the dielectric material with the second thickness, which is greater than or equal to a thickness required to prevent breakdown when the source follower transistor is operating in a saturation regime.

16. The method of claim 15, wherein the second thickness is at least twice as thick as the first thickness.

17. The method of claim 15, wherein the dielectric material gradually transitions from the first thickness to the second thickness between the gate electrode and the active region of the semiconductor material.

18. The method of claim 13, further comprising forming a reset transistor coupled to the floating diffusion to reset charge in the floating diffusion in response to a rest signal being applied to a second gate terminal of the reset transistor.

19. The method of claim 13, wherein forming the dielectric material includes depositing or growing at least one of hafnium oxide, silicon oxide, silicon nitride, or aluminum oxide.

20. The method of claim 13, further comprising:
forming control circuitry coupled to control operation of the one or more photodiodes; and
forming readout circuitry coupled to a bit line to read out image data from the one or more photodiodes.

* * * * *

UNITED STATES PATENT AND TRADEMARK OFFICE
CERTIFICATE OF CORRECTION

PATENT NO. : 10,964,738 B2  
APPLICATION NO. : 16/149544  
DATED : March 30, 2021  
INVENTOR(S) : G. Chen et al.

Page 1 of 1

It is certified that error appears in the above-identified patent and that said Letters Patent is hereby corrected as shown below:

On the Title Page

Item (54) and in the Specification, Column 1, Lines 1-3, change "IMAGE" to -- AN IMAGE --.

Signed and Sealed this  
Twenty-fifth Day of July, 2023

Katherine Kelly Vidal  
*Director of the United States Patent and Trademark Office*